(12) United States Patent
Jung et al.

(10) Patent No.: US 9,411,236 B2
(45) Date of Patent: Aug. 9, 2016

(54) PATTERNING METHOD USING ELECTRON BEAM AND EXPOSURE SYSTEM CONFIGURED TO PERFORM THE SAME

(71) Applicant: Samsung Electronics Co., Ltd., Suwon-si (KR)

(72) Inventors: Yongseok Jung, Hwaseong-si (KR); SangHee Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/854,637

(22) Filed: Sep. 15, 2015

(65) Prior Publication Data

US 2016/0004161 A1 Jan. 7, 2016

Related U.S. Application Data

(63) Continuation of application No. 14/197,824, filed on Mar. 5, 2014, now Pat. No. 9,164,389.

(30) Foreign Application Priority Data

Aug. 29, 2013 (KR) .................. 10-2013-0103462

(51) Int. Cl.
*G03F 7/20* (2006.01)
*H01J 37/06* (2006.01)
*G03F 1/20* (2012.01)
*H01J 37/317* (2006.01)

(52) U.S. Cl.
CPC ............... *G03F 7/2061* (2013.01); *G03F 1/20* (2013.01); *G03F 7/20* (2013.01); *G03F 7/2059* (2013.01); *G03F 7/2063* (2013.01); *H01J 37/3174* (2013.01); *H01J 2237/3045* (2013.01); *H01J 2237/31776* (2013.01)

(58) Field of Classification Search
CPC ........... G03F 1/20; G03F 7/20; G03F 7/2061; G03F 7/2059; G03F 7/2063; H01J 37/3174; H01J 2237/3045; H01J 2237/31776
USPC .................. 430/30, 296, 394, 942; 250/492.2
See application file for complete search history.

(56) References Cited

U.S. PATENT DOCUMENTS

| | | | |
|---|---|---|---|
| 6,977,715 B2 | 12/2005 | Wu | |
| 6,983,444 B2 | 1/2006 | Yang | |
| 7,820,344 B2 | 10/2010 | Moon | |
| 8,039,176 B2 | 10/2011 | Fujimura et al. | |
| 8,283,094 B2 | 10/2012 | Fujimura et al. | |
| 8,343,695 B2 | 1/2013 | Fujimura et al. | |
| 8,501,374 B2 | 8/2013 | Fujimura et al. | |
| 8,916,315 B2 | 12/2014 | Fujimura et al. | |
| 2003/0226130 A1 | 12/2003 | Ki et al. | |
| 2005/0259237 A1 | 11/2005 | Wu | |
| 2008/0315323 A1 | 12/2008 | Moon | |
| 2011/0053056 A1 | 3/2011 | Fujimura et al. | |
| 2011/0165778 A1 | 7/2011 | Choi et al. | |
| 2012/0025108 A1 | 2/2012 | Fujimura et al. | |
| 2012/0034554 A1 | 2/2012 | Fujimura et al. | |
| 2013/0122406 A1 | 5/2013 | Fujimura et al. | |
| 2013/0316273 A1 | 11/2013 | Fujimura et al. | |
| 2015/0106772 A1 | 4/2015 | Fujimura et al. | |

FOREIGN PATENT DOCUMENTS

| | | |
|---|---|---|
| CN | 102023489 | 4/2011 |
| JP | 3084760 | 7/2000 |
| JP | 2009069171 | 4/2009 |
| JP | 2009086385 | 4/2009 |
| KR | 1994011203 | 11/1994 |
| KR | 2001005118 | 1/2001 |
| KR | 2009056107 | 6/2009 |
| KR | 100924338 | 10/2009 |
| KR | 100930377 | 11/2009 |
| KR | 1997016770 | 9/2011 |

OTHER PUBLICATIONS

"Patterning Method Using Electron Beam and Exposure System Configured to Perform the Same" Specification, Drawings, Claims and Prosecution History, of U.S. Appl. No. 14/197,824, filed Mar. 5, 2014, by Yongseok Jung, et al. which is stored in the United States Patent and Tradmark Office (USPTO) Image File Wrapper (IFW) system.

*Primary Examiner* — Christopher Young
(74) *Attorney, Agent, or Firm* — Onello & Mello LLP

(57) ABSTRACT

A patterning method may employ a particle beam, such as an electron beam (E-beam) and an exposure system that may include preparing an exposure layout defining a spatial distribution of an E-beam, performing an E-beam exposure process to a mask layer, based on the exposure layout, performing a developing process to the mask layer to form mask patterns including a first pattern. The first pattern may be a single solid pattern, and the exposure layout may include a first data associated with a plurality of E-beam conditions defined for a first region corresponding to the first pattern.

14 Claims, 12 Drawing Sheets

| Condition I | $I_{CT} = I_{ED} = I_{CR}$ |
| Condition II | $I_{CT} \leq I_{ED} \leq I_{CR}$ |
| Condition III | $I_{CT} \geq I_{ED} \leq I_{CR}$ |
| Condition IV | $I_{CT} = I_{ED} \leq I_{CR}$ |

PATTERNING METHOD USING ELECTRON BEAM AND EXPOSURE SYSTEM CONFIGURED TO PERFORM THE SAME

CROSS-REFERENCE TO RELATED APPLICATIONS

This application is a continuation of U.S. patent application Ser. No. 14/197,824, filed on Mar. 5, 2014, which claims priority to Korean Patent Application No. 10-2013-0103462, filed on Aug. 29, 2013, in the Korean Intellectual Property Office, the entire contents of which are hereby incorporated by reference.

BACKGROUND OF THE INVENTION

Exemplary embodiments in accordance with principles of inventive concepts relate to a method for forming fine patterns, and in particular, to a patterning method using a particle beam, such as an electron beam (E-beam), and an exposure system configured to form the patterns.

By using the lithography technology, it is possible to copy or transcribe data associated with spatial disposition of patterns (hereinafter, referred to as a layout data) onto a target layer, with high productivity. For example, fine patterns of a photo mask or a semiconductor device may be formed, with high productivity, by a patterning process including lithography and etching steps.

In the case of the lithography step for fabricating a photo mask, an electron beam may be used for a copying or transcribing the layout data. However, a reduction in size of patterns may result in various technical difficulties (for example, associated with pattern resolution and/or process fidelity).

SUMMARY

Exemplary embodiments in accordance with principles of inventive concepts provide a patterning method capable of realizing high pattern resolution.

Other example embodiments of inventive concepts provide a patterning method capable of forming patterns with fidelity.

Still other example embodiments of inventive concepts provide a patterning method capable of forming patterns with high resolution and high fidelity.

Even other example embodiments of inventive concepts provide an exposure system capable of realizing high pattern resolution.

Yet other example embodiments of inventive concepts provide an exposure system capable of forming patterns with fidelity.

Further example embodiments of inventive concepts provide an exposure system capable of forming patterns with high resolution and high fidelity.

According to exemplary embodiments in accordance with principles of inventive concepts, a method of forming a pattern may include preparing an exposure layout defining a spatial distribution of an electron beam (E-beam), performing an E-beam exposure process to a mask layer, based on the exposure layout, performing a developing process to the mask layer to form mask patterns including a first pattern. The first pattern may be a single solid pattern, and the exposure layout may include a first data including a plurality of E-beam conditions defined for a first region corresponding to the first pattern.

In exemplary embodiments in accordance with principles of inventive concepts, the first region may include a plurality of exposure regions, to which the E-beam is irradiated, and a non-exposure region, to which the E-beam is prevented. At least two different doses may be applied to the exposure regions.

In exemplary embodiments in accordance with principles of inventive concepts, the exposure regions may be spaced apart from each other by the non-exposure region.

In exemplary embodiments in accordance with principles of inventive concepts, the exposure regions may be connected to each other, and the non-exposure region may be spaced apart from each other by the exposure regions.

In exemplary embodiments in accordance with principles of inventive concepts, in a region of the first region, the exposure regions may be spaced apart from each other by the non-exposure region, and in other region of the first region, the exposure regions may be connected to each other and the non-exposure region may include a plurality of portions spaced apart from each other by the exposure regions.

In exemplary embodiments in accordance with principles of inventive concepts, the first pattern may include a plurality of edge portions, a central portion located between the edge portions, and at least one corner portion located at intersections of the edge portions, and doses of E-beams irradiated to regions corresponding to the central portion, the edge portion, and the corner portion may be substantially equivalent to each other.

In exemplary embodiments in accordance with principles of inventive concepts, the first pattern may include a plurality of edge portions, a central portion located between the edge portions, and at least one corner portion located at intersections of the edge portions, and doses of E-beams irradiated to regions corresponding to the central portion, the edge portions, and the corner portion may be increased in the listed order.

In exemplary embodiments in accordance with principles of inventive concepts, the first pattern may include a plurality of edge portions, a central portion located between the edge portions, and at least one corner portion located at intersections of the edge portions, a dose of E-beam irradiated to a region corresponding to the central portion may be larger than a dose of E-beam irradiated to a region corresponding to the edge portion, and a dose of E-beam irradiated to a region corresponding to the corner portion may be larger than a dose of E-beam irradiated to a region corresponding to the edge portion.

In exemplary embodiments in accordance with principles of inventive concepts, the first pattern may include a plurality of edge portions, a central portion located between the edge portions, and at least one corner portion located at intersections of the edge portions, and doses of E-beams irradiated to regions corresponding to the central and edge portions may be substantially equivalent to each other and may be smaller than a dose of E-beam irradiated to a region corresponding to the corner portion.

In exemplary embodiments in accordance with principles of inventive concepts, the E-beam exposure process may be performed using a multi-beam exposure technology.

In exemplary embodiments in accordance with principles of inventive concepts, the method may further include performing an etching process to a target layer disposed below the mask patterns. The target layer constitutes a photomask.

According to exemplary embodiments in accordance with principles of inventive concepts, an electron beam (E-beam) exposure system may include a data storing part storing an exposure layout, an E-beam exposing part performing an E-beam exposure process to a mask layer, and a controlling part controlling the E-beam exposure process of the E-beam exposing part, based on the exposure layout. The E-beam exposing part may be configured to irradiate E-beams having at least two different doses to a first region, where a single solid pattern will be formed.

In exemplary embodiments in accordance with principles of inventive concepts, the first region may include a plurality of exposure regions, to which the E-beam is irradiated, and a non-exposure region, to which the E-beam is prevented.

In exemplary embodiments in accordance with principles of inventive concepts, the E-beam exposing part may be configured in such a way that E-beams having at least two different doses are irradiated to the exposure regions at substantially the same time.

In exemplary embodiments in accordance with principles of inventive concepts, the exposure regions may be spaced apart from each other by the non-exposure region.

In exemplary embodiments in accordance with principles of inventive concepts, the exposure regions may be connected to each other, such that the non-exposure region may include a plurality of portions spaced apart from each other by the exposure regions.

In exemplary embodiments in accordance with principles of inventive concepts, in a region of the first region, the exposure regions may be spaced apart from each other by the non-exposure region, and in other region of the first region, the exposure regions may be connected to each other and the non-exposure region may include a plurality of portions spaced apart from each other by the exposure regions.

In exemplary embodiments in accordance with principles of inventive concepts, the single solid pattern may include a plurality of edge portions, a central portion located between the edge portions, and at least one corner portion located at intersections of the edge portions, and the E-beam exposing part may be configured in such a way that doses of E-beams irradiated to regions corresponding to the central, edge, and corner portions are substantially equivalent to each other.

In exemplary embodiments in accordance with principles of inventive concepts, the single solid pattern may include a plurality of edge portions, a central portion located between the edge portions, and at least one corner portion located at intersections of the edge portions, and the E-beam exposing part may be configured in such a way that doses of E-beams irradiated to regions corresponding to the central, edge, and corner portions are increased in the listed order.

In exemplary embodiments in accordance with principles of inventive concepts, the single solid pattern may include a plurality of edge portions, a central portion located between the edge portions, and at least one corner portion located at intersections of the edge portions, and the E-beam exposing part may be configured in such a way that doses of E-beams to irradiated to regions corresponding to the central and corner portions are larger than a dose of E-beam irradiated to a region corresponding to the edge portion.

In exemplary embodiments in accordance with principles of inventive concepts, the single solid pattern may include a plurality of edge portions, a central portion located between the edge portions, and at least one corner portion located at intersections of the edge portions, and the E-beam exposing part may be configured in such a way that doses of E-beams irradiated to regions corresponding to the central and edge portions are substantially equivalent to each other and are smaller than a dose of E-beam irradiated to a region corresponding to the corner portion.

In exemplary embodiments in accordance with principles of inventive concepts a method of forming a pattern for a solid state device may include preparing an exposure layout defining a spatial distribution of an electron beam (E-beam), performing an E-beam exposure process to a mask layer, based on the exposure layout, performing a developing process to the mask layer to form mask patterns including a first pattern, wherein the first pattern is a single solid pattern, and the exposure layout comprises a first data including a plurality of E-beam conditions defined for a first region corresponding to the first pattern.

In exemplary embodiments in accordance with principles of inventive concepts a method of forming a pattern for a solid state device may include a first region that includes a plurality of exposure regions, to which the E-beam is irradiated; and a non-exposure region, to which the E-beam is not irradiated, wherein the plurality of E-beam defined conditions include at least two different doses applied to the exposure regions.

In exemplary embodiments in accordance with principles of inventive concepts a method of forming a pattern for a solid state device may include exposure regions spaced apart from each other by the non-exposure region.

In exemplary embodiments in accordance with principles of inventive concepts a method of forming a pattern for a solid state device may include exposure regions connected to each other, and the non-exposure region are spaced apart from each other by the exposure regions.

In exemplary embodiments in accordance with principles of inventive concepts a method of forming a pattern for a solid state device may include in a region of the first region, the exposure regions are spaced apart from each other by the non-exposure region, and in other region of the first region, the exposure regions are connected to each other and the non-exposure region comprises a plurality of portions spaced apart from each other by the exposure regions.

In exemplary embodiments in accordance with principles of inventive concepts a method of forming a pattern for a solid state device may include a first pattern including a plurality of edge portions, a central portion located between the edge portions, and at least one corner portion located at intersections of the edge portions, and doses of E-beams irradiated to regions corresponding to the central portion, the edge portion, and the corner portion are substantially equivalent to each other.

In exemplary embodiments in accordance with principles of inventive concepts a method of forming a pattern for a solid state device may include a first pattern including a plurality of edge portions, a central portion located between the edge portions, and at least one corner portion located at intersections of the edge portions, and doses of E-beams irradiated to regions corresponding to the central portion, the edge portions, and the corner portion are increased in the listed order.

In exemplary embodiments in accordance with principles of inventive concepts a method of forming a pattern for a solid state device may include a first pattern including a plurality of edge portions, a central portion located between the edge portions, and at least one corner portion located at intersections of the edge portions, a dose of E-beam irradiated to a region corresponding to the central portion is larger than a dose of E-beam irradiated to a region corresponding to the edge portion, and a dose of E-beam irradiated to a region corresponding to the corner portion is larger than a dose of E-beam irradiated to a region corresponding to the edge portion.

In exemplary embodiments in accordance with principles of inventive concepts a method of forming a pattern for a solid state device may include a first pattern including a plurality of edge portions, a central portion located between the edge portions, and at least one corner portion located at intersections of the edge portions, and doses of E-beams irradiated to regions corresponding to the central and edge portions are substantially equivalent to each other and are smaller than a dose of E-beam irradiated to a region corresponding to the corner portion.

In exemplary embodiments in accordance with principles of inventive concepts a method of forming a pattern for a solid state device may include an E-beam exposure process performed using a multi-beam exposure technology.

In exemplary embodiments in accordance with principles of inventive concepts a method of forming a pattern for a solid state device may include performing an etching process to a target layer disposed below the mask patterns, wherein the target layer constitutes a photo mask.

In exemplary embodiments in accordance with principles of inventive concepts a system may include a data storing part for storing an exposure layout; an E-beam exposing part for performing an E-beam exposure process to a mask layer; and a controlling part for controlling the E-beam exposure process of the E-beam exposing part, based on the exposure layout, wherein the E-beam exposing part is configured to irradiate E-beams having at least two different doses to a first region, where a single solid pattern will be formed.

In exemplary embodiments in accordance with principles of inventive concepts a system may include a first region including a plurality of exposure regions, to which the E-beam is irradiated; and a non-exposure region, to which the E-beam is prevented.

In exemplary embodiments in accordance with principles of inventive concepts a system may include an E-beam exposing part configured to irradiate exposure regions with E-beams having at least two different doses at substantially the same time.

In exemplary embodiments in accordance with principles of inventive concepts a system may include exposure regions are spaced apart from each other by the non-exposure region.

In exemplary embodiments in accordance with principles of inventive concepts a system may include exposure regions connected to each other, such that the non-exposure region comprises a plurality of portions spaced apart from each other by the exposure regions.

In exemplary embodiments in accordance with principles of inventive concepts a system may include a region of the first region, the exposure regions are spaced apart from each other by the non-exposure region, and in other region of the first region, the exposure regions are connected to each other and the non-exposure region comprises a plurality of portions spaced apart from each other by the exposure regions.

In exemplary embodiments in accordance with principles of inventive concepts a system may include a single solid pattern that includes a plurality of edge portions, a central portion located between the edge portions, and at least one corner portion located at intersections of the edge portions, and the E-beam exposing part is configured in such a way that doses of E-beams irradiated to regions corresponding to the central, edge, and corner portions are substantially equivalent to each other.

In exemplary embodiments in accordance with principles of inventive concepts a system may include a single solid pattern including a plurality of edge portions, a central portion located between the edge portions, and at least one corner portion located at intersections of the edge portions, and the E-beam exposing part is configured in such a way that doses of E-beams irradiated to regions corresponding to the central, edge, and corner portions are increased in the listed order.

In exemplary embodiments in accordance with principles of inventive concepts a system may include a single solid pattern including a plurality of edge portions, a central portion located between the edge portions, and at least one corner portion located at intersections of the edge portions, and the E-beam exposing part is configured in such a way that doses of E-beams to irradiated to regions corresponding to the central and corner portions are larger than a dose of E-beam irradiated to a region corresponding to the edge portion.

In exemplary embodiments in accordance with principles of inventive concepts a system may include 21 a single solid pattern including a plurality of edge portions, a central portion located between the edge portions, and at least one corner portion located at intersections of the edge portions, and the E-beam exposing part is configured in such a way that doses of E-beams irradiated to regions corresponding to the central and edge portions are substantially equivalent to each other and are smaller than a dose of E-beam irradiated to a region corresponding to the corner portion.

In exemplary embodiments in accordance with principles of inventive concepts a method may include producing a design layout, including open and closed features; and producing an exposure layout, including irradiation and non-irradiation regions, corresponding to the design layout, wherein the irradiation regions include a plurality of beam dosage levels.

In exemplary embodiments in accordance with principles of inventive concepts a method may include a step of producing an exposure layout that includes employing feedback to determine beam dosage levels included in the exposure layout.

In exemplary embodiments in accordance with principles of inventive concepts a method may include exposing a target piece according to the exposure layout.

In exemplary embodiments in accordance with principles of inventive concepts a method may include a target piece that is a semiconductor layout mask.

In exemplary embodiments in accordance with principles of inventive concepts a method may include a target piece that is a semiconductor layer.

In exemplary embodiments in accordance with principles of inventive concepts a method may include a target piece that is developed after exposing.

In exemplary embodiments in accordance with principles of inventive concepts a method may include a target piece that is etched after developing.

In exemplary embodiments in accordance with principles of inventive concepts a method may include exposure that is executed by an electron beam.

In exemplary embodiments in accordance with principles of inventive concepts a method may include a condition of the electron beam is controlled magnetically.

In exemplary embodiments in accordance with principles of inventive concepts a method may include a design layout that is for a microelectromechanical system.

In exemplary embodiments in accordance with principles of inventive concepts a method may include an exposure layout is for a plurality of patterns distributed on a wafer.

In exemplary embodiments in accordance with principles of inventive concepts a method may include a plurality of E-beam sources.

In exemplary embodiments in accordance with principles of inventive concepts a method may include each of the plurality of E-beam sources providing an electron stream of a different flux.

In exemplary embodiments in accordance with principles of inventive concepts a method may include each of the plurality of E-beam sources providing an electron stream of a different energy.

In exemplary embodiments in accordance with principles of inventive concepts an electronic device may include a layer in the device exposed according to an exposure layout, wherein the exposure layout includes irradiation and non-irradiation regions corresponding to a design layout, wherein a irradiation region includes a plurality of beam dosage levels.

In exemplary embodiments in accordance with principles of inventive concepts an electronic system includes an electronic device that includes a layer in the device exposed according to an exposure layout, wherein the exposure layout includes irradiation and non-irradiation regions corresponding to a design layout, wherein a irradiation region includes a plurality of beam dosage levels.

In exemplary embodiments in accordance with principles of inventive concepts a portable electronic device includes an electronic device that includes a layer in the device exposed according to an exposure layout, wherein the exposure layout includes irradiation and non-irradiation regions corresponding to a design layout, wherein a irradiation region includes a plurality of beam dosage levels.

In exemplary embodiments in accordance with principles of inventive concepts a cellular telephone includes an electronic device that includes a layer in the device exposed according to an exposure layout, wherein the exposure layout includes irradiation and non-irradiation regions corresponding to a design layout, wherein a irradiation region includes a plurality of beam dosage levels.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
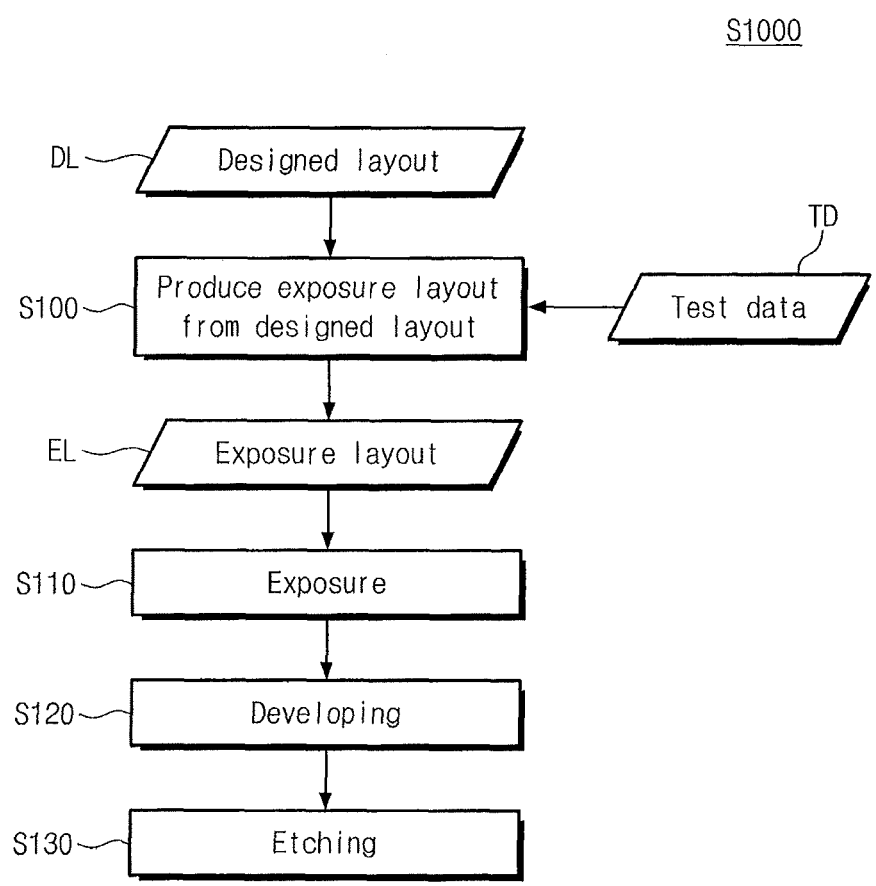
FIG. 1 is a flow chart exemplarily illustrating a process of forming a target structure, according to exemplary embodiments in accordance with principles of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to, describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

A method of forming a structure (hereinafter, referred to as a "target structure") including fine patterns will be described below. According to exemplary embodiments in accordance with principles of inventive concepts, the target structure may be formed using charged particles, also referred to herein as a particle beam. In exemplary embodiments in accordance with principles of inventive concepts, the charged particles may be provided in the form of an electron beam (E-beam). In order to reduce complexity in the drawings and to provide better understanding of exemplary embodiments in accordance with principles of inventive concepts, the description that follows will refer to an exemplary embodiment in which the charged particles are provided in the form of the E-beam, but embodiments in accordance with principles of inventive concepts are not limited thereto.

A method in accordance with principles of inventive concepts may employ a particle beam having at least two different values of one or more conditions to create a pattern in a target piece. To create the pattern in the target piece a design layout may be produced, with regions that may be open or closed, positive or negative. The design layout may be used in accordance with principles of inventive concepts to produce an exposure layout that dictates operation of the particle beam in order to produce the open (irradiated, for example) or closed (non-irradiated, for example) regions in the target piece. In accordance with principles of inventive concepts, the regions that are to be irradiated may be irradiates using different beam intensities, for example. That is, rather than a simple, binary, translation from the design layout to the exposure layout, a method in accordance with principles of inventive concepts may employ a plurality of beam conditions, such as beam intensity, within a single region of an exposure layout (and irradiate accordingly in later process steps).

In exemplary embodiments, the particle beam may be an electron beam and a condition may be beam intensity, for example. The method may be used in accordance with principles of inventive concepts to create patterned mask for semiconductor manufacturing, or may be used to directly write a pattern on a semiconductor, for example. Feedback may be employed by a system in accordance with principles of inventive concepts to adjust beam conditions, for example. Such feedback may be obtained real-time, or may be as a result of tests performed on objects created by the beam, also referred to herein as target pieces. A pattern that is to be transferred to a target piece, such as a semiconductor mask, for example, may be referred to herein as a design layout. The design layout may be transferred to a target piece, such as a semiconductor mask or semiconductor layer, by the irradiating the target piece with the electron beam using a controlled irradiation pattern. To form the pattern, some regions are not irradiated by the beam. Beam steering, blocking, or other process may be employed in accordance with principles of inventive concepts to prevent irradiation of those areas that are not to be irradiated. A region of the target piece that is to be irradiated, also referred to herein as a "solid pattern," may be irradiated with a beam having a plurality of intensity levels. That is, rather than employing a simple binary, "off, or on" application of the electron beam, a method in accordance with principles of inventive concepts employs an "off, or on with one intensity, or on with another intensity, or on with another . . . " and the plurality of intensity levels may be applied within each irradiated region. That is, the various intensities need not be applied to different irradiation regions, but may be applied within a single irradiation region. Patterns of irradiated and non-irradiated areas may form a larger pattern and, as in a semiconductor wafer layout, for example, such larger patterns may be repeated to form a layout for a plurality of devices.

In exemplary embodiments a target region may be a rectangular region, or the tip of a rectangular region, with a center portion, two edge portions, and a pair of corner portions located at the intersections of two edge portions. To overcome resolution issues, blurring, or other process issues, a method in accordance with principles of inventive concepts may control the intensity of beam delivered to each of those regions, for example.

FIG. 1 is a flow chart illustrating a process of forming a target structure, according to exemplary embodiments in accordance with principles of inventive concepts. FIGS. 2 through 5 are sectional views illustrating a process of forming a target structure, according to exemplary embodiments in accordance with principles of inventive concepts.

Figure 2:
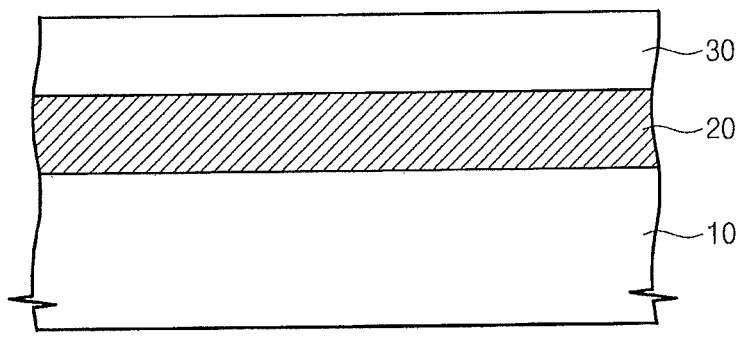
FIGS. 2 through 5 are sectional views exemplarily illustrating a process of forming a target structure, according to exemplary embodiments in accordance with principles of inventive concepts.

Referring first to FIG. 2, a target layer 20 and a mask layer 30 may be sequentially formed on a substrate 10. In order to reduce complexity in the drawings and to provide better understanding of exemplary embodiments in accordance with principles of inventive concepts, the description that follows will refer to an example of the present embodiment in which the target layer 20 and the substrate 10 are used as layers constituting a photomask. That is, the target structure may be a photo mask, but embodiments in accordance with principles of inventive concepts are not limited thereto. For example, in other exemplary embodiments, the target structure may be a product to be fabricated by a microelectromechanical system (MEMS) technology. Target layer 20 and substrate 10 may be employed by a semiconductor device in accordance with principles of inventive concepts and such semiconductor devices may be employed in electronic devices in accordance with principles of inventive concepts.

Referring to FIG. 1, a process of forming a target structure (in S1000) may include a plurality of steps for realizing spatial arrangement of one or more patterns, which are defined by a design layout DL, in the target layer 20. For example, the design layout DL may be prepared to define spatial information on patterns to be formed in the target structure, and the process S1000 may be performed to copy or transcribe the design layout DL to the target layer 20. In exemplary embodiments in accordance with principles of inventive concepts, the design layout may be stored in the form of electronic or optical information, in an electronic or optical data storage or an electronic system including the same.

Figure 3:
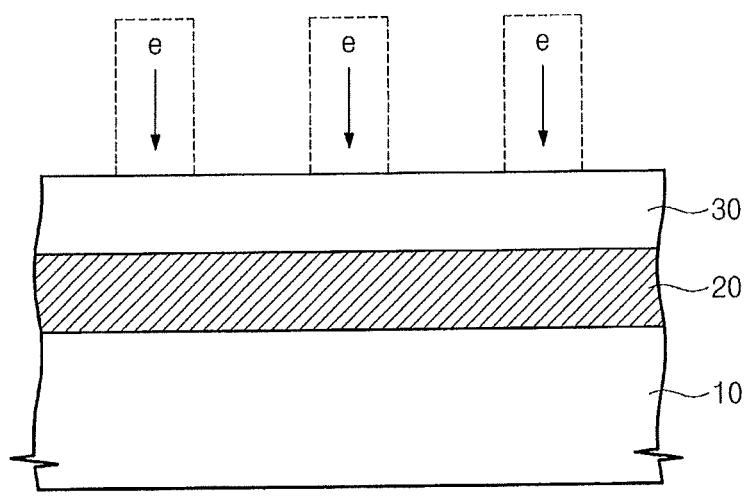
Figure 4:
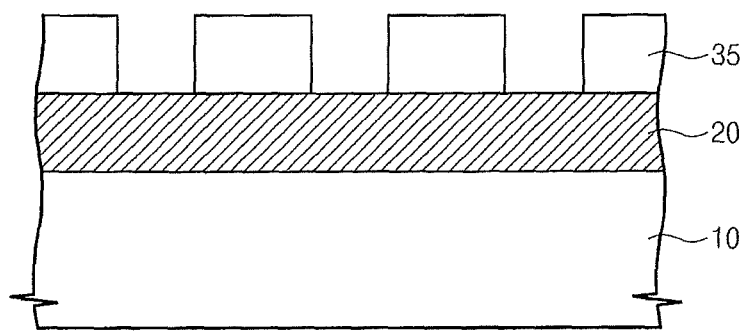
Figure 5:
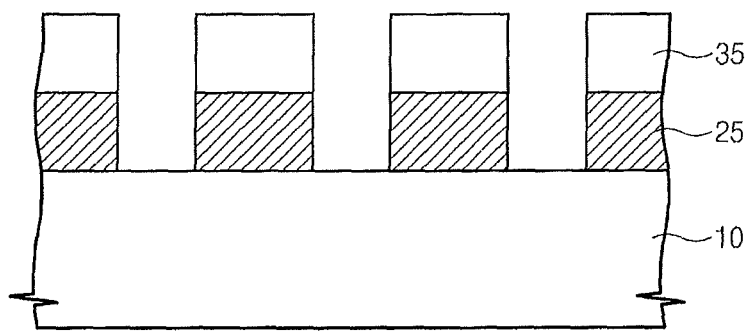

According to exemplary embodiments in accordance with principles of inventive concepts, the process S1000 may include a step S100 of producing an exposure layout EL from the design layout DL, a step S110 of exposing a mask layer 30, a step S120 of developing the exposed mask layer 30, and a step S130 of etching a target layer 20. As shown in FIG. 3, the step S110 of exposing the mask layer 30 may include exposing the mask layer 30 with an E-beam, based on the exposure layout EL. That is, selective exposure of the mask layer 30 may be determined by the mask layout EL. As shown in FIG. 4, the step S120 of developing the exposed mask layer 30 may include selectively removing portions of the mask layer 30 exposed by the E-beam to form a mask pattern 35. As shown in FIG. 5, the step S130 of etching the target layer 20 may include etching the target layer 20 (for example, anisotropically) using the mask pattern 35 as an etch mask. As the result of the etching step S130, the target patterns 25, whose spatial disposition and arrangement are defined by the design layout DL, may be formed on substrate 10.

An E-beam may be used for copying or transcribing the design layout DL onto the mask layer 30, in the exposure step S110. However, as the result of distortional effects, such as beam blur and secondary electrons, the shape of the mask pattern 35 may be different from the shape of a region of the mask layer 30 exposed by the E-beam. In exemplary embodiments in accordance with principles of inventive concepts, the exposure layout EL may be configured to reduce such a difference in shape between the design layout DL and the target patterns 25. That is, in accordance with principles of inventive concepts, an exposure layout EL may be configured to pre-compensate for distortional effects. The step S100 of producing the exposure layout EL in accordance with principles of inventive concepts from the design layout DL will be described in more detail with reference to FIGS. 6 through 12.

Figure 6:
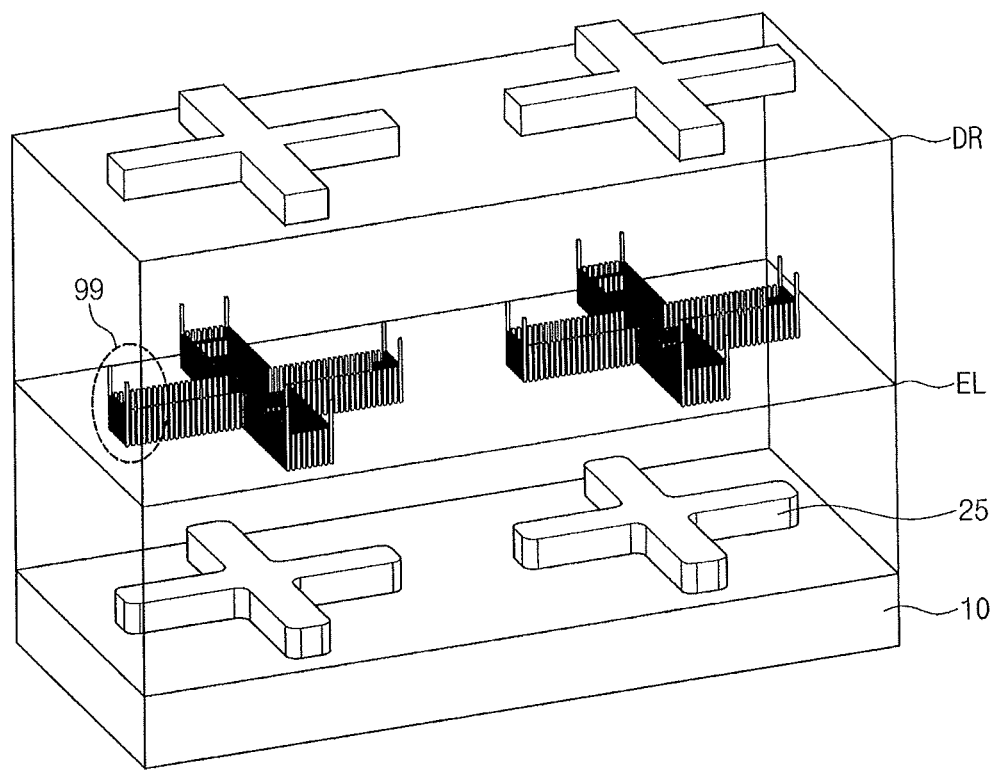
FIG. 6 is a schematic diagram illustrating relationship between an exposure layout, a design layout, and target patterns, according to exemplary embodiments in accordance with principles of inventive concepts.
Figure 7:
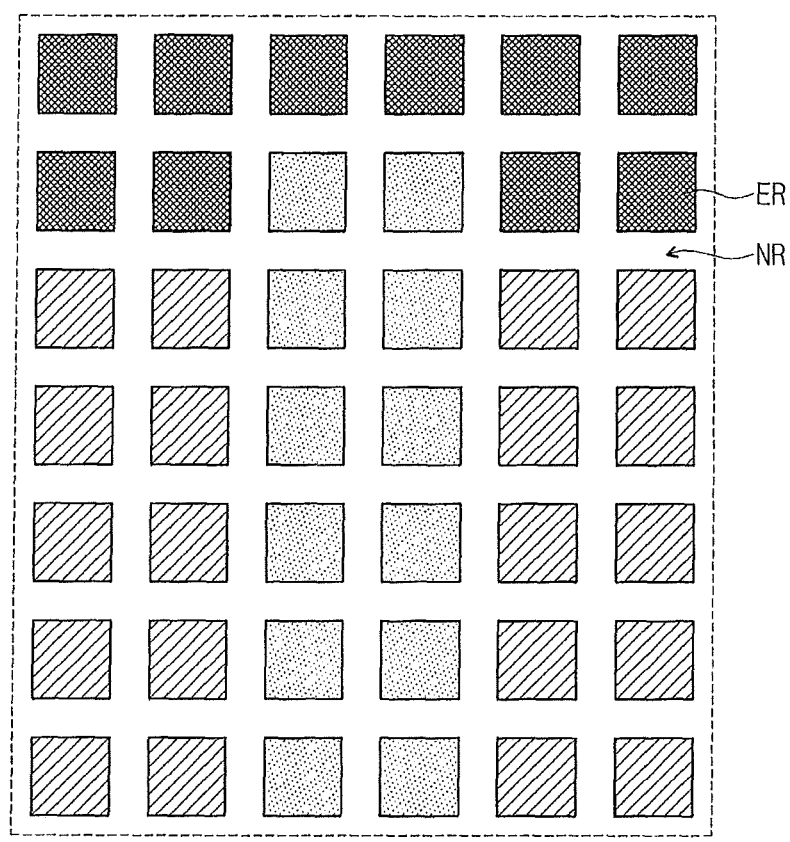
FIGS. 7 through 9 are diagrams exemplarily illustrating a portion of an exposure layout, according to exemplary embodiments in accordance with principles of inventive concepts.
Figure 8:
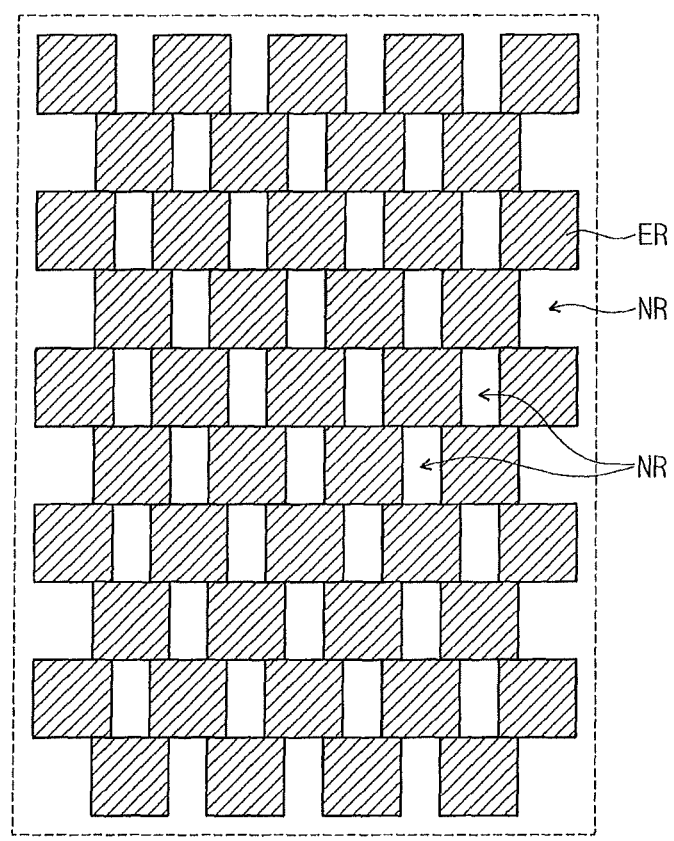
Figure 9:
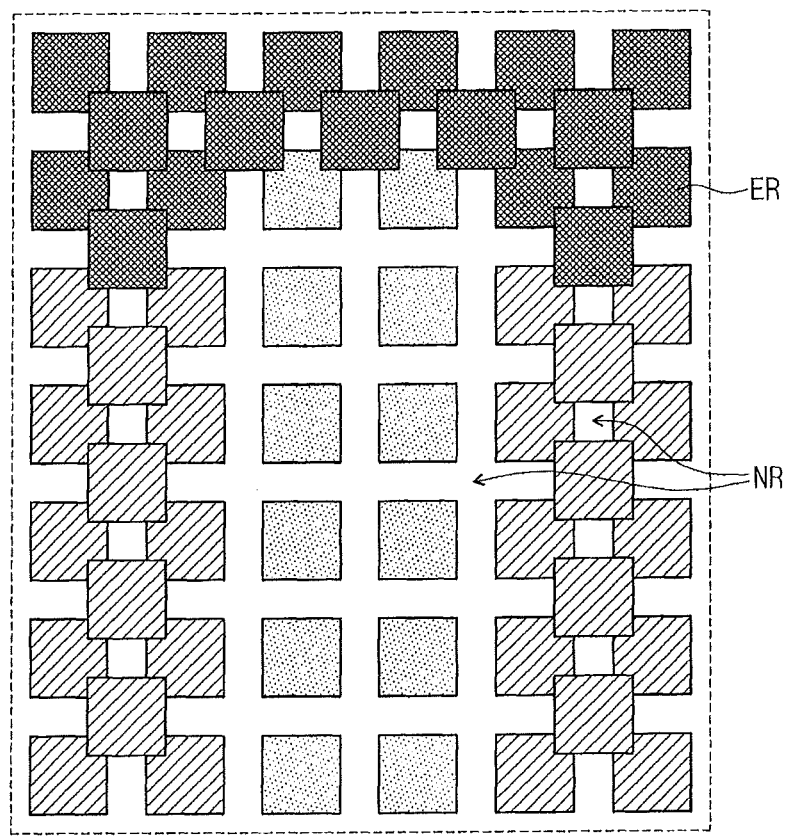

FIG. 6 is a schematic diagram illustrating relationships among the exposure layout EL, the design layout DL, and the target patterns 25, according to exemplary embodiments in accordance with principles of inventive concepts. FIGS. 7 through 9 are diagrams illustrating a portion of an exposure layout, according to exemplary embodiments in accordance with principles of inventive concepts.

In exemplary embodiments in accordance with principles of inventive concepts, exposure step S110 may be performed using the exposure layout EL produced from the design layout DL, rather than directly employing design layout DL. By employing exposure layout EL in accordance with principles of inventive concepts, target pattern 25 may have a pattern shape defined by the design layout DL and, in particular, by modifying the design layout DL based on theoretical or empirical data (for example, test data (TD)), as shown in FIG. 1, target pattern 25 may more closely match the intended pattern, as embodied in design layout DL, for example.

In exemplary embodiments in accordance with principles of inventive concepts, a plurality of solid patterns may be defined by the design layout DL. In this exemplary embodiment, when viewed in plan or layout view, each of the solid patterns may be a single continuous pattern, regardless of its shape. For example, FIG. 6 shows two cross-shaped solid patterns which may be included in the design layout DL.

In exemplary embodiments in accordance with principles of inventive concepts, for each of the solid patterns defined in the design layout DL, the exposure layout EL may be produced to define a plurality of exposure regions ER, where an E-beam is to be irradiated, and at least one non-exposure region NR, where the E-beam is not to be irradiated (that is, is to be blocked, for example). For example, as shown in FIG. 6, the exposure layout EL may be produced to define an array, in which a plurality of exposure regions are included, for each of the solid patterns.

In exemplary embodiments in accordance with principles of inventive concepts, the exposure regions ER may be disposed spaced apart from each other by the non-exposure region NR. For example, as exemplarily shown in FIG. 7, the exposure regions ER may be separated from each other by a mesh-shaped non-exposure region NR, and thus, the exposure regions ER may be two-dimensionally arranged with regularity.

In other example embodiments, the exposure regions ER may be connected to each other, and thus, the non-exposure region may be spaced apart from each other by the exposure regions ER. For example, as exemplarily shown in FIG. 8, the non-exposure region NR may be divided into a plurality of isolated portions by the exposure regions ER connected to each other.

In still other example embodiments, as exemplarily shown in FIG. 9, the exposure regions ER may be disposed spaced apart from each other by the non-exposure region NR in a portion (for example, central portion) of a region associated with each solid pattern, and the exposure regions ER may be connected to each other in other portion (for example, edge and corner portions).

Figure 10:
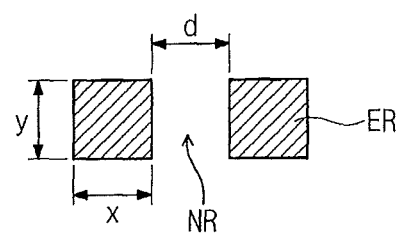
FIG. 10 is a diagram exemplarily illustrating disposition of exposure regions, according to exemplary embodiments in accordance with principles of inventive concepts.

However, the dispositions and structures of the exposure regions ER described with reference to FIGS. 7 through 9 may be variously changed yet remain within the realm of inventive concepts. For example, as shown in FIG. 10, a space d of an adjacent pair of the exposure regions ER and widths, x and y, of each exposure region ER may be variously changed in consideration of shape, position, and/or pattern density of a solid pattern under consideration as well as shape, position, and distance of other solid pattern adjacent thereto.

In exemplary embodiments in accordance with principles of inventive concepts, at least two different exposure conditions (for example, in dose) may be defined for the E-beam to be applied to the exposure regions ER. That is, in accordance with principles of inventive concepts, each of the solid patterns may be realized by applying a plurality of E-beam exposure conditions to the exposure regions ER. For example, as exemplarily shown in FIG. 11 (with region 99 corresponding to region 99 of FIG. 6), at least four different intensities $I_1, I_2, I_3$, and $I_4$ may be defined for the E-beam to be irradiated to the exposure regions ER. For purposes of illustration, beam intensity corresponds to height and shading in the exemplary embodiment of FIG. 11. However, similar to the dispositions and structures of the exposure regions ER, in accordance with principles of inventive concepts the exposure conditions may be variously changed in consideration of shape, position, and/or pattern density of a solid pattern under consideration (for example, the pattern that is to be transferred), as well as shape, position, and distance of other solid pattern adjacent thereto.

Figure 12:
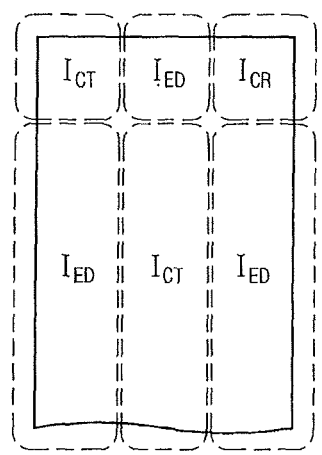
FIG. 12 is a diagram exemplarily showing exposure conditions of electron beams, which can be applied to the exposure regions, according to exemplary embodiments in accordance with principles of inventive concepts.

For example, in the case where a solid pattern under consideration includes rectangular portions facing each other, an exposure condition (for example, dose) of the E-beam for the exposure regions ER may be configured to satisfy one of four conditions, as shown in FIG. 12.

As shown in FIG. 12, a solid pattern under consideration may include a plurality of edge portions, a central portion located between the edge portions, and a pair of corner portions located at intersections of the edge portions. In exemplary embodiments in accordance with principles of inventive concepts, corresponding to condition I, doses of E-beams irradiated to the exposure regions ER corresponding to the central portion (CT), the edge portion (ED), and the corner portion (CR) may be substantially equivalent to each other. In other words, the exposure regions ER located at the central portion, the edge portions, and the corner portions may be irradiated with E-beams having substantially the same dose; that is, $I_{CT}=I_{ED}=I_{CR}$.

In other exemplary embodiments, corresponding to condition II, doses of the E-beams may be smaller in the exposure regions ER located at the central portion than in the exposure regions ER located at the edge portion (i.e., $I_{CT}<I_{ED}$) and be smaller in the exposure regions ER located at the edge portion than in the exposure regions ER located at the corner portion (i.e., $I_{ED}<I_{CR}$), for example.

In other exemplary embodiments, as corresponding to condition III, doses of the E-beams may be greater in the exposure regions ER located at the central portion than in the exposure regions ER located at the edge portion (i.e., $I_{CT}>I_{ED}$) and be smaller in the exposure regions ER located at the edge portion than in the exposure regions ER located at the corner portion (i.e., $I_{ED}<I_{CR}$).

In other exemplary embodiments, as shown in the condition IV, doses of the E-beams irradiated to the exposure regions ER located at the central and edge portions may be substantially equal to that at the corner portions and smaller than doses of the E-beams irradiated to the exposure regions ER located at the corner portion (i.e., $I_{CT}=I_{ED}<I_{CR}$). Combinations of such conditions and corresponding exposure patterns are contemplated within the scope of inventive concepts.

Figure 13:
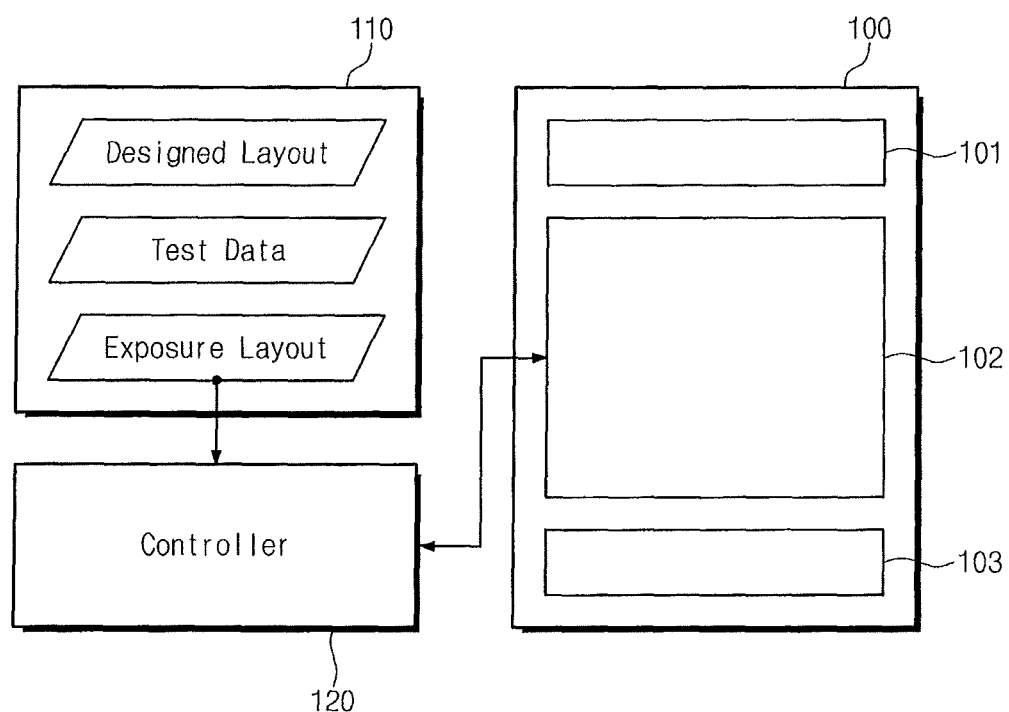
FIG. 13 is a block diagram exemplarily illustrating an electron beam exposure system according to exemplary embodiments in accordance with principles of inventive concepts.

FIG. 13 is a block diagram of an E-beam exposure system according to exemplary embodiments in accordance with principles of inventive concepts. An E-beam exposure system in accordance with principles of inventive concepts may include an E-beam device 100, a data storing part 110, and a controlling part 120. E-beam device 100 may include an E-beam generating part 101 generating an E-beam, a stage 103, on which a structure including the target layer and the mask layer is loaded, and a beam guiding structure 102 guiding the E-beam onto the stage 103.

The beam guiding structure 102 may include at least one of a lens structure for controlling direction of the E-beam, a shaping structure for controlling shape (that is, cross-sectional shape, for example) of the E-beam, and an aperture structure for controlling sectional size of the E-beam. At least one of the lens, shaping and aperture structures may be configured to use an electromagnetic interaction with the E-beam.

In exemplary embodiments in accordance with principles of inventive concepts, the beam guiding structure 102 may be configured to implement a multi-beam exposure technology. For example, the beam guiding structure 102 may be configured to effect the exposure and non-exposure regions ER and NR described with reference to FIGS. 6 through 10 at a time (that is, in a single exposure, for example). In exemplary embodiments, for each of the solid patterns, the beam guiding structure 102 may be configured to irradiate the E-beam simultaneously to the exposure regions ER, which are spaced apart from each other by the non-exposure region NR, as shown in FIG. 7. Similarly, the beam guiding structure 102 may be configured to realize the disposition of the non-exposure and exposure regions NR and ER, which are exemplarily illustrated in FIGS. 8 through 10, through one-time process, also referred to herein as a single-exposure or irradiation process.

Figure 11:
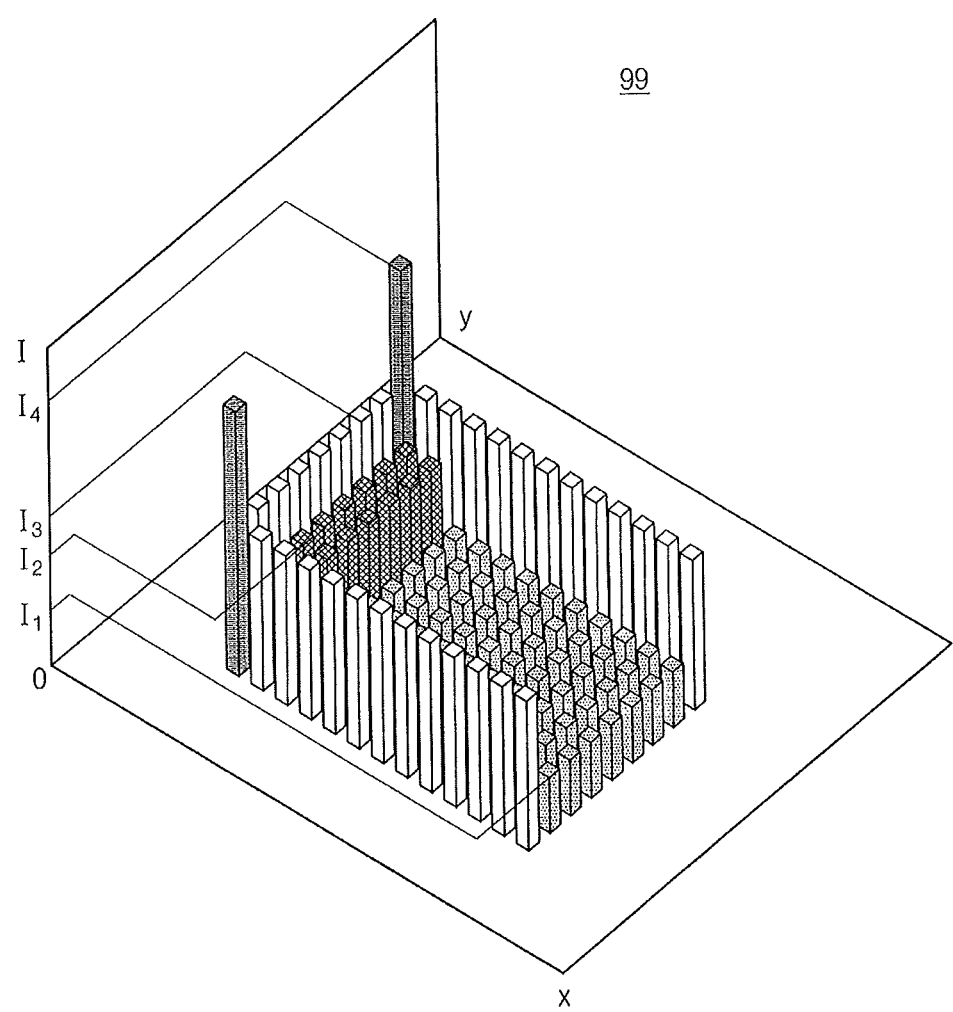
FIG. 11 is a diagram enlarging a portion of an exposure layout of FIG. 6.

Additionally, as previously described with reference to FIGS. 11 and 12, the beam guiding structure 102 may be configured to apply a plurality of E-beam exposure conditions to the exposure regions ER for each of the solid patterns at a time (in a single exposure, for example).

Figure 14:
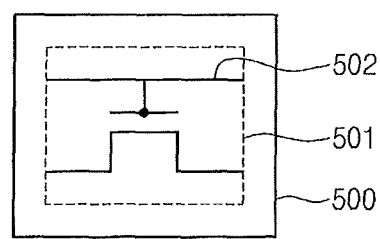
FIG. 14 is a diagram exemplarily illustrating an electronic product, to which an electron beam exposure technology is applied, according to exemplary embodiments in accordance with principles of inventive concepts.

FIG. 14 is a diagram exemplarily illustrating an electronic product, to which an E-beam exposure technology is applied, according to exemplary embodiments in accordance with principles of inventive concepts.

According to exemplary embodiments, E-beam exposure technology in accordance with principles of inventive concepts may be used to fabricate a photomask. For example, the solid patterns may be patterns (positive or negative) formed on such a photo mask. The photomask may be used to fabricate a product 500 including a transistor 501, as shown in FIG. 14, or an integrated circuit including such a transistor, or an electronic product including such an integrated circuit, for example. In exemplary embodiments, the transistor 501 may include a gate electrode 502, and the gate electrode 502 may be formed using a patterning method, in which a photo mask fabricated by E-beam exposure technology in accordance with principles of inventive concepts is used.

According to exemplary embodiments in accordance with principles of inventive concepts, electron beams having at least two different exposure conditions, such as doses, are simultaneously irradiated to a region where a single solid pattern will be formed. The use of such electron beams makes it possible to form patterns with high resolution and high fidelity.

Figure 15:
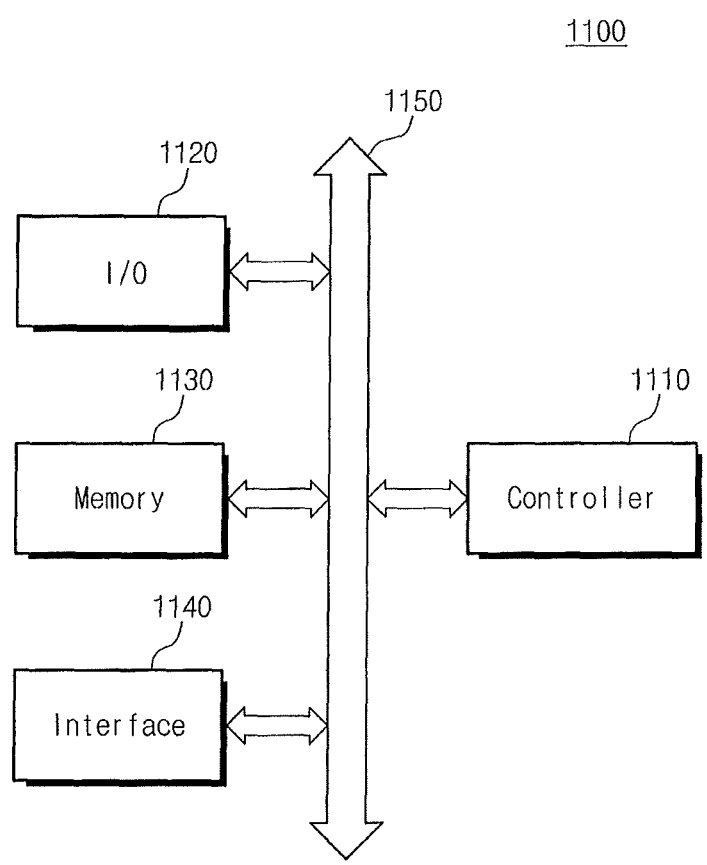
FIG. 15 is a block diagram of an electronic system including semiconductor devices according to some embodiments of inventive concepts.

FIG. 15 is a block diagram of an electronic system including a semiconductor device in accordance with principles of inventive concepts.

Electronic system 1100 may include a controller 1110, an input/output device (I/O) 1120, a memory 1130, an interface 1140 and a bus 1150. The controller 1110, the I/O 1120, the memory 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as working memory for improving the operation of the controller 1110. A semiconductor device in accordance with principles of inventive concepts may be provided in the memory 1130 or may be provided some components of the controller 1110 or the I/O 1120, for example.

The electronic system 1100 may be applied to a portable electronic device, such as a personal digital assistant (PDA), a portable computer, a web tablet, a wireless phone, a mobile phone, a digital music player, a memory card, or any type of electronic device capable of transmitting and/or receiving information in a wireless environment.

Figure 16:
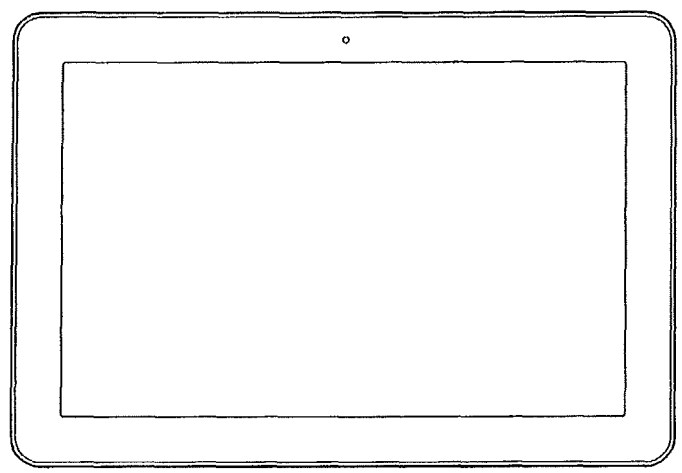
FIGS. 16 and 17 illustrate an exemplary semiconductor system to which semiconductor devices according to some embodiments of inventive concepts can be employed.
Figure 17:
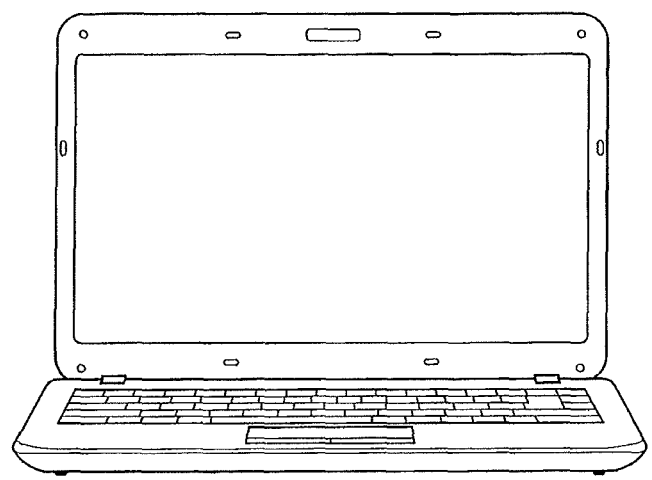

FIGS. 16 and 17 illustrate an exemplary semiconductor system to which a semiconductor device in accordance with principles of inventive concepts can be employed. FIG. 16 illustrates an example in which a semiconductor device in accordance with principles of inventive concepts is applied to a portable electronic device such as a tablet PC or cellular telephone, and FIG. 17 illustrates an example in which a semiconductor device in accordance with principles of inventive concepts is applied to a notebook computer. Semiconductor devices in accordance with principles of inventive concepts may also be applied to other IC devices not illustrated herein.

While exemplary embodiments of inventive concepts have been particularly shown and described, it will be understood that variations in form and detail may be made therein without departing from the spirit and scope of inventive concepts.

What is claimed is:

1. An electron beam (E-beam) exposure system, comprising:
    a data storing part for storing an exposure layout;
    an E-beam exposing part for performing an E-beam exposure process to a mask layer; and
    a controlling part for controlling the E-beam exposure process of the E-beam exposing part, based on the exposure layout,
    wherein the E-beam exposing part is configured to irradiate E-beams having at least two different doses to a first region, where a single solid pattern will be formed.

2. The E-beam exposure system of claim 1, wherein the first region comprises:
    a plurality of exposure regions, to which the E-beam is irradiated; and
    a non-exposure region, to which the E-beam is prevented.

3. The E-beam exposure system of claim 2, wherein the E-beam exposing part is configured to irradiate exposure regions with E-beams having at least two different doses at substantially the same time.

4. The E-beam exposure system of claim 2, wherein the exposure regions are spaced apart from each other by the non-exposure region.

5. The E-beam exposure system of claim 2, wherein the exposure regions are connected to each other, such that the non-exposure region comprises a plurality of portions spaced apart from each other by the exposure regions.

6. The E-beam exposure system of claim 2, wherein, in a region of the first region, the exposure regions are spaced apart from each other by the non-exposure region, and in other region of the first region, the exposure regions are connected to each other and the non-exposure region comprises a plurality of portions spaced apart from each other by the exposure regions.

7. The E-beam exposure system of claim 1, wherein the single solid pattern comprises a plurality of edge portions, a central portion located between the edge portions, and at least one corner portion located at intersections of the edge portions, and
    the E-beam exposing part is configured in such a way that doses of E-beams irradiated to regions corresponding to the central, edge, and corner portions are substantially equivalent to each other.

8. The E-beam exposure system of claim 1, wherein the single solid pattern comprises a plurality of edge portions, a central portion located between the edge portions, and at least one corner portion located at intersections of the edge portions, and
    the E-beam exposing part is configured in such a way that doses of E-beams irradiated to regions corresponding to the central, edge, and corner portions are increased in the listed order.

9. The E-beam exposure system of claim 1, wherein the single solid pattern comprises a plurality of edge portions, a central portion located between the edge portions, and at least one corner portion located at intersections of the edge portions, and
    the E-beam exposing part is configured in such a way that doses of E-beams to irradiated to regions corresponding to the central and corner portions are larger than a dose of E-beam irradiated to a region corresponding to the edge portion.

10. The E-beam exposure system of claim 1, wherein the single solid pattern comprises a plurality of edge portions, a central portion located between the edge portions, and at least one corner portion located at intersections of the edge portions, and
    the E-beam exposing part is configured in such a way that doses of E-beams irradiated to regions corresponding to the central and edge portions are substantially equivalent to each other and are smaller than a dose of E-beam irradiated to a region corresponding to the corner portion.

11. The E-beam exposure system of claim 2, wherein a space and widths of an adjacent pair of the exposure regions change depending on at least one of shape, position, and/or pattern density of the single solid pattern.

12. The E-beam exposure system of claim 1, wherein the at least two different doses of the E-beams change depending on at least one of shape, position, and/or pattern density of the single solid pattern.

13. The E-beam exposure system of claim 1, further comprising:
    an E-beam generating part to generate the E-beam;
    a stage on which a target layer and a mask layer is loaded; and
    a beam guiding structure to guide the E-beam onto the stage.

14. The E-beam exposure system of claim 1, wherein the single solid pattern is a pattern on a photomask.

* * * * *